United States Patent
Itabashi et al.

(10) Patent No.: US 9,698,023 B2
(45) Date of Patent: Jul. 4, 2017

(54) TRAVELING-WAVE AMPLIFIER

(71) Applicant: SUMITOMO ELECTRIC INDUSTRIES, LTD., Osaka-shi, Osaka (JP)

(72) Inventors: Naoki Itabashi, Yokohama (JP); Taizo Tatsumi, Yokohama (JP); Masataka Watanabe, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/841,414

(22) Filed: Aug. 31, 2015

(65) Prior Publication Data
US 2016/0072462 A1    Mar. 10, 2016

(30) Foreign Application Priority Data
Sep. 10, 2014    (JP) .................................. 2014-184397

(51) Int. Cl.
*H03F 3/60*    (2006.01)
*H01L 21/288*    (2006.01)
(Continued)

(52) U.S. Cl.
CPC ..... *H01L 21/2885* (2013.01); *H03F 3/45475* (2013.01); *H03F 3/607* (2013.01);
(Continued)

(58) Field of Classification Search
CPC . H03F 3/193; H03F 3/60; H03F 3/605; H03F 3/602; H03F 3/607; H03F 2200/18; H03F 2203/21109
(Continued)

(56) References Cited

U.S. PATENT DOCUMENTS 5,550,513 A * 8/1996 Wong ..................... H03G 7/001
330/286
8,704,592 B2 * 4/2014 Tatsumi .............. H03F 3/45089
330/286
(Continued)

FOREIGN PATENT DOCUMENTS

JP    4-170031 A    6/1992
JP    4-171823 A    6/1992
(Continued)

OTHER PUBLICATIONS

Yves Baeyens et al., "High Gain-Bandwidth Differential Distributed InP D-HBT Driver Amplifiers With Large (11.3 Vpp) Swing at 40 Gbls", IEEE Journal of Solid-State Circuits, vol. 39, No. 10, 2004, pp. 1697-1705.
(Continued)

*Primary Examiner* — Khanh V Nguyen
(74) *Attorney, Agent, or Firm* — Global IP Counselors, LLP

(57) ABSTRACT

A traveling-wave amplifier includes a plurality of amplifier cells, an insulating layer, an input line, and an output line. The plurality of amplifier cells is provided on a semiconductor substrate. Each of the amplifier cells receives an input signal and generates a part of an output signal from the input signal. The insulating layer is provided on the semiconductor substrate. The input line is used to externally receive an input signal and to transmit the input signal to the amplifier cells respectively. The output line is used to transmit the output signal generated by the amplifier cells and to externally output the output signal. The thickness of the input line is smaller than the thickness of the output line, and the input line and the output line are provided on the same insulating layer.

10 Claims, 9 Drawing Sheets

(51) Int. Cl.
*H03F 3/45* (2006.01)
*H03F 1/02* (2006.01)
*H03F 1/07* (2006.01)

(52) U.S. Cl.
CPC .............. *H03F 1/0288* (2013.01); *H03F 1/07* (2013.01); *H03F 3/60* (2013.01); *H03F 2200/451* (2013.01); *H03F 2203/45138* (2013.01)

(58) Field of Classification Search
USPC ............................................ 330/53, 54, 286
See application file for complete search history.

(56) References Cited

U.S. PATENT DOCUMENTS

| 9,182,617 | B2* | 11/2015 | Tatsumi | ................ | G02F 1/0121 |
| 2008/0042751 | A1* | 2/2008 | Heydari | .................. | H03F 3/604 |
| | | | | | 330/286 |

FOREIGN PATENT DOCUMENTS

| JP | 4-206827 A | 7/1992 |
| JP | 11-186270 A | 7/1999 |

OTHER PUBLICATIONS

R.S. Virk et al., "40-GHz MMICs for Optical Modulator Driver Applications", 2002 IEEE MTT-S Digest, pp. 91-94.

* cited by examiner

TRAVELING-WAVE AMPLIFIER

CROSS-REFERENCE TO RELATED APPLICATIONS

This application claims priority under 35 U.S.C. §119 (a) to Japanese Patent Application No. 2014-184397, filed in Japan on September 10, 2014, the entire contents of which are hereby incorporated herein by reference.

BACKGROUND OF THE INVENTION

1. Field of the Invention

The present invention relates to a traveling-wave amplifier (TWA) formed by using a semiconductor process.

2. Description of the Related Art

With the recent rapid increase in traffic of data communication, there has been a continuous demand for further increasing the capacity of communication networks and the transmission rate of communication signals. Accordingly, optical transmission systems having an increased transmission rate of communication signals from 10 Gbps to 40 Gbps and further to 100 Gbps are being developed, for example.

The TWAs are excellent in terms of high-speed response. Therefore, in an optical transmitter (optical transmission unit) of an optical transmission system, for example, a TWA is used to drive an optical modulation device, a laser diode, or the like that converts an electrical signal into an optical signal. In general, in a case of attaining a high gain by combining a plurality of amplifiers (amplifier cells), an operating frequency (bandwidth) of a wider range can be set for a TWA than for an amplifier including the same number of amplifier cells as the TWA, the amplifier cells being arranged in a cascade connection.

FIG. 7 illustrates a comparative example of an equivalent circuit diagram. As illustrated in FIG. 7, a TWA 101 includes input lines 111 and 112 that are connected to a plurality of amplifier cells 110, and output lines 121 and 122 that are connected to the plurality of amplifier cells 110. The plurality of amplifier cells 110 has the same characteristics. The input lines 111 and 112 and the output lines 121 and 122 are transmission lines having predetermined characteristic impedance. For example, rectangular symbols 111a, 112a, 121a, and 122a illustrated in FIG. 7 each represent an equivalent circuit of a corresponding transmission line per predetermined length. The equivalent circuit of the input line 111 is configured by using symbols 111a that are connected in series, for example.

FIG. 8 illustrates an example of an equivalent circuit where a single signal is input to the TWA 101 illustrated in FIG. 7, and a single signal is output from the TWA 101 in response to the single signal that is input. A circuit operation in which each amplifier cell 110 receives an input signal, amplifies the input signal, and outputs the resulting signal as a part of an output signal is called a single-ended operation. A circuit that performs a single-ended operation is called a single-ended circuit. In FIG. 8, to a connecting node between adjacent symbols 111a of the input line 111, an input terminal 110a of the amplifier cell 110 is connected. To a connecting node between adjacent symbols 121a of the output line 121, an output terminal 110b of the amplifier cell 110 is connected. Here, it is assumed that the wiring resistance $R_{in}$ of the input line 111 and the wiring resistance $R_{out}$ of the output line 121 are assumed to be 0, and the gate capacitance $C_{gs}$ and the drain capacitance $C_{ds}$ of a transistor Tr in the amplifier cell 110 are taken into consideration. In this case, the characteristic impedance $Z_{in}$ of the input line 111 and the characteristic impedance $Z_{out}$ of the output line 121 are respectively calculated by using Eq. 1 and Eq. 2 below, where the capacitance of the input line 111 is denoted by $C_{in}$, the inductance of the input line 111 is denoted by $L_{in}$, the capacitance of the output line 121 is denoted by $C_{out}$, and the inductance of the output line 121 is denoted by $L_{out}$.

$$Z_{in} = \sqrt{L_{in}/(C_{in}+C_{gs})} \tag{1}$$

$$Z_{out} = \sqrt{L_{out}/(C_{out}+C_{ds})} \tag{2}$$

On the other hand, the input line 111 can be regarded as LC filters arranged in a cascade connection of n stages, and the cut-off frequency f of the input line 111 is calculated by using Eq. 3 below. In Eq. 3, as the number of stages n of the LC filters increases, the cut-off frequency f becomes lower. As the length of the input line 111 increases, the inductance $L_{in}$ becomes larger, and therefore, the cut-off frequency f becomes lower. The DC resistance of the input line 111 is equal to $n \times R_{in}$, and therefore, the DC resistance becomes larger as the number of stages n increases. Note that the number of stages n is equal to the number of the amplifier cells 110 included in the TWA 101.

$$f = 1/(\sqrt{L_{in}(C_{in}+C_{gs})} \times \sqrt{n}) \tag{3}$$

The input line 111 and the output line 121 of the TWA 101 are formed as coplanar lines. A coplanar line having desired characteristic impedance is formed by adjusting the inductance, the capacitance, and the like of the coplanar line. FIG. 9 illustrates a cross-section taken along line IX-IX of FIG. 7. In FIG. 9, the input line 111 is formed as wiring (interior wiring) on a semiconductor substrate 31, and the output line 121 is formed as plated wiring on an insulating layer 32 that is provided on the input line 111.

The above-described TWA 101 may be required to output a driving signal having large amplitude. For example, a Mach-Zehnder modulator (MZM), which is one type of optical modulation device, requires a driving signal having amplitude ranging from 2.5 V to 8 V. In a case where the TWA 101 is used to drive such an MZM, the number n of the amplifier cells 110 of the TWA 101 is increased to thereby increase the gain (total gain). In this case, however, the input line 111 and the output line 121 of the TWA 101 have a longer length of 2 mm to 6 mm, for example. Accordingly, as the number of stages n of the amplifier cells 110 increases, the input line 111 becomes longer, and the cut-off frequency f of the input line 111 decreases, resulting in degradation of high-speed response of the TWA 101. In order to restrain degradation of high-speed response, it is better to decrease the line width (breadth) of the input line 111 and to decrease the parasitic capacitance $C_{in}$ of the input line 111. In this case, however, the cross-section area of the face of the input line 111 perpendicular to the traveling direction of signals decreases, and the DC resistance of the input line 111 increases. It is difficult to make the input line 111 thicker in order to make up for such shortcomings because the flatness of the insulating layer 32 provided on the input line 111 is a trade-off and because the aspect ratio in production is limited.

In a case of thickening metal wiring that constitutes the output line 121 in order to increase the current-carrying capacity of the output line 121, the aspect ratio is limited in production so that the line width of the metal wiring that constitutes the output line 121 unsuitably increases. As a result, an area needed to form plated wiring of the output line 121 increases. On the other hand, downsizing of an apparatus (optical transmission system, for example) having the TWA 101 and high-density integration of serviced channels are required. Furthermore, the TWA 101 used in the apparatus is required to be downsized and to attain high performance. Therefore, it is desired that, in the TWA 101, the current-carrying capacity of the output line 121 is increased and an area occupied by the output line 121 on the semiconductor substrate 31 is reduced.

SUMMARY OF THE INVENTION

The present invention is made in view of the above-described shortcomings, and an object thereof is to provide a traveling-wave amplifier capable of outputting driving signals of large amplitude and capable of being downsized.

A traveling-wave amplifier according to an aspect of the present invention includes a plurality of amplifier cells, an insulating layer, an input line, and an output line. The plurality of amplifier cells is provided on a semiconductor substrate. Each of the amplifier cells receives an input signal and generates a part of an output signal from the input signal. The insulating layer is provided on the semiconductor substrate. The input line is used to externally receive the input signal and to transmit the input signal to the amplifier cells respectively. The output line is used to transmit the output signal generated by the amplifier cells and to externally output the output signal at one end of the output line. The thickness of the input line is smaller than the thickness of the output line. The input line and the output line are provided on the same insulating layer so as to touch the same face of the same insulating layer opposite the semiconductor substrate.

According to the aspect of the present invention, it is possible to provide a traveling-wave amplifier capable of outputting driving signals of large amplitude and capable of being downsized.

DESCRIPTION OF THE PREFERRED EMBODIMENTS

Figure 1:
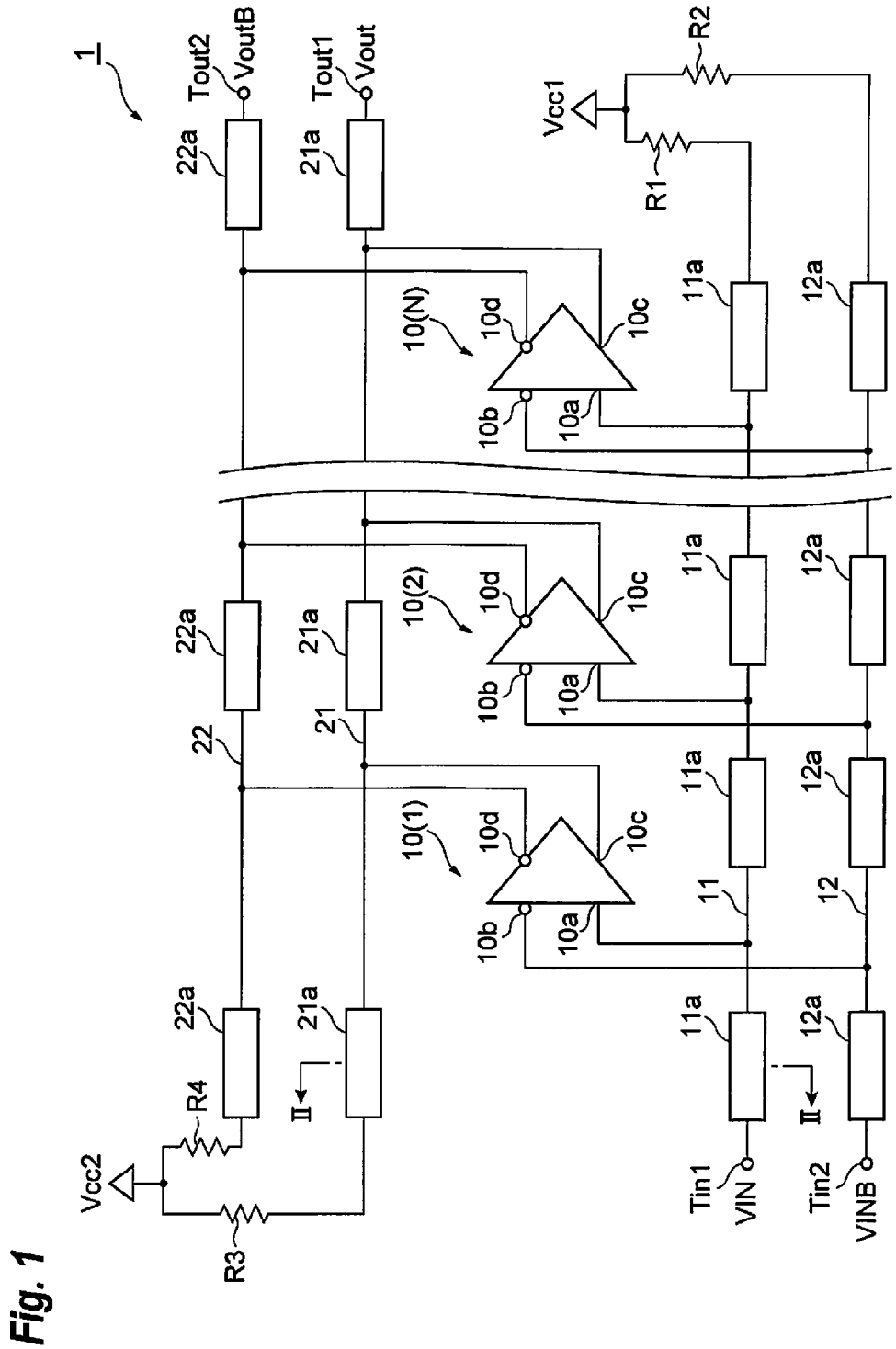
FIG. 1 is a diagram illustrating a circuit configuration of a traveling-wave amplifier (TWA) according to an embodiment.

Hereinafter, preferred embodiments of the present invention will be described in detail with reference to the attached drawings. Note that, in the description given below, the same elements or elements having the same function are assigned the same reference numeral, and duplicated description thereof will be omitted.

FIG. 1 is a diagram illustrating a circuit configuration of a traveling-wave amplifier (TWA) according to an embodiment. In FIG. 1, a TWA 1 includes N (N represents an integer equal to or larger than 2) differential amplifiers. In FIG. 1, a first differential amplifier 10(1) to an N-th differential amplifier 10(N), input lines 11 and 12, and output lines 21 and 22 are illustrated. The integer N may be between 4 and 6, for example, or may be between 8 and 12, for example. In this embodiment, the first differential amplifier 10(1) to the N-th differential amplifier 10(N) may be called a plurality of amplifier cells.

The first differential amplifier 10(1) to the N-th differential amplifier 10(N) are provided on the semiconductor substrate 31 (see FIG. 2) described below, and each include an input terminal 10a, an input terminal 10b, an output terminal 10c, and an output terminal 10d. Specifically, the input terminal 10a is a non-inverted input terminal of each of the first differential amplifier 10(1) to the N-th differential amplifier 10(N), and the input terminal 10b is an inverted input terminal of each of the first differential amplifier 10(1) to the N-th differential amplifier 10(N). The output terminal 10c is a non-inverted output terminal of each of the first differential amplifier 10(1) to the N-th differential amplifier 10(N), and the output terminal 10d is an inverted output terminal of each of the first differential amplifier 10(1) to the N-th differential amplifier 10(N). In each of the first differential amplifier 10(1) to the N-th differential amplifier 10(N), the input terminal 10a is connected to the input line 11, and the input terminal 10b is connected to the input line 12. The output terminal 10c is connected to the output line 21, and the output terminal 10d is connected to the output line 22. To the input terminals 10a and 10b of each of the first differential amplifier 10(1) to the N-th differential amplifier 10(N), parts of an input signal may be input at different timings respectively. From the output terminals 10c and 10d of each of the first differential amplifier 10(1) to the N-th differential amplifier 10(N), parts of an output signal may be output at different timings respectively.

The input line 11 is a coplanar line having a plurality of rectangular symbols 11a. The input line 11 is used to transmit a positive-phase input signal (positive-phase input voltage) VIN input to a terminal Tin1 from outside the TWA 1, to the input terminals 10a of the first differential amplifier 10(1) to the N-th differential amplifier 10(N) respectively. Each of symbols 11a represents an equivalent circuit of the input line 11 per predetermined length. The symbols 11a are connected in cascade to thereby constitute the input line 11. The terminal Tin1 is provided at the input end of the input line 11, and the positive-phase input voltage VIN is input to the terminal Tin1, for example. The other end of the input line 11 opposite to the terminal Tin1 is connected to a power supply line Vcc1 via a resistor R1. As illustrated in FIG. 1, the input terminal 10a of the first differential amplifier 10(1) is connected to a connecting node between adjacent symbols 11a of the input line 11. Note that the term "connection" used herein means not only a direct connection but also an electrical connection and a functional connection.

The input line 12 is a coplanar line having a plurality of rectangular symbols 12a. The input line 12 is used to transmit a negative-phase input signal (negative-phase input voltage) VINB input to a terminal Tin2 from outside the TWA 1, to the input terminals 10b of the first differential amplifier 10(1) to the N-th differential amplifier 10(N) respectively. The positive-phase input voltage VIN has a phase different by 180 degrees from that of the negative-phase input voltage VINB. The positive-phase input voltage VIN and the negative-phase input voltage VINB are complementary signals to each other. Each of symbols 12a represents an equivalent circuit of the input line 12 per predetermined length. The symbols 12a are connected in series to thereby constitute the input line 12. The terminal Tin2 is provided at the input end of the input line 12, and the negative-phase input voltage VINB is input to the terminal Tin2, for example. The other end of the input line 12 opposite to the terminal Tin2 is connected to the power supply line Vcc1 via a resistor R2. As illustrated in FIG. 1, the input terminal 10b of the first differential amplifier 10(1) is connected to a connecting node between adjacent symbols 12a of the input line 12, for example.

The output line 21 is a coplanar line having a plurality of rectangular symbols 21a. The output line 21 is used to transmit output signals respectively output from the output terminals 10c of the first differential amplifier 10(1) to the N-th differential amplifier 10(N), to a terminal Tout1. The output signals transmitted to the terminal Tout1 are superimposed to output a positive-phase output signal Vout to the outside of the TWA 1. Each of symbols 21a represents an equivalent circuit of the output line 21 per predetermined length. The symbols 21a are connected in cascade to thereby constitute the output line 21. The terminal Tout1 is provided at the output end of the output line 21, and the positive-phase output signal Vout is output from the terminal Tout1, for example. The other end of the output line 21 opposite to the terminal Tout1 is connected to a power supply line Vcc2 via a resistor R3. As illustrated in FIG. 1, the output terminal 10c of the first differential amplifier 10(1) is connected to a connecting node between adjacent symbols 21a of the output line 21, for example.

The output line 22 is a coplanar line having a plurality of rectangular symbols 22a. The output line 22 is used to transmit output signals respectively output from the output terminals 10d of the first differential amplifier 10(1) to the N-th differential amplifier 10(N), to a terminal Tout2. The output signals transmitted to the terminal Tout2 are superimposed to output a negative-phase output signal VoutB to the outside of the TWA 1. The positive-phase output voltage Vout has a phase different by 180 degrees from that of the negative-phase output voltage VoutB. The positive-phase output voltage Vout and the negative-phase output voltage VoutB are complementary signals to each other. Each of symbols 22a represents an equivalent circuit of the output line 22 per predetermined length. The symbols 22a are connected in cascade to thereby constitute the output line 22. The terminal Tout2 is provided at the output end of the output line 22, and the negative-phase output signal VoutB is output from the terminal Tout2, for example. The other end of the output line 22 opposite to the terminal Tout2 is connected to the power supply line Vcc2 via a resistor R4. As illustrated in FIG. 1, the output terminal 10d of the first differential amplifier 10(1) is connected to a connecting node between adjacent symbols 22a of the output line 22, for example.

Figure 2:
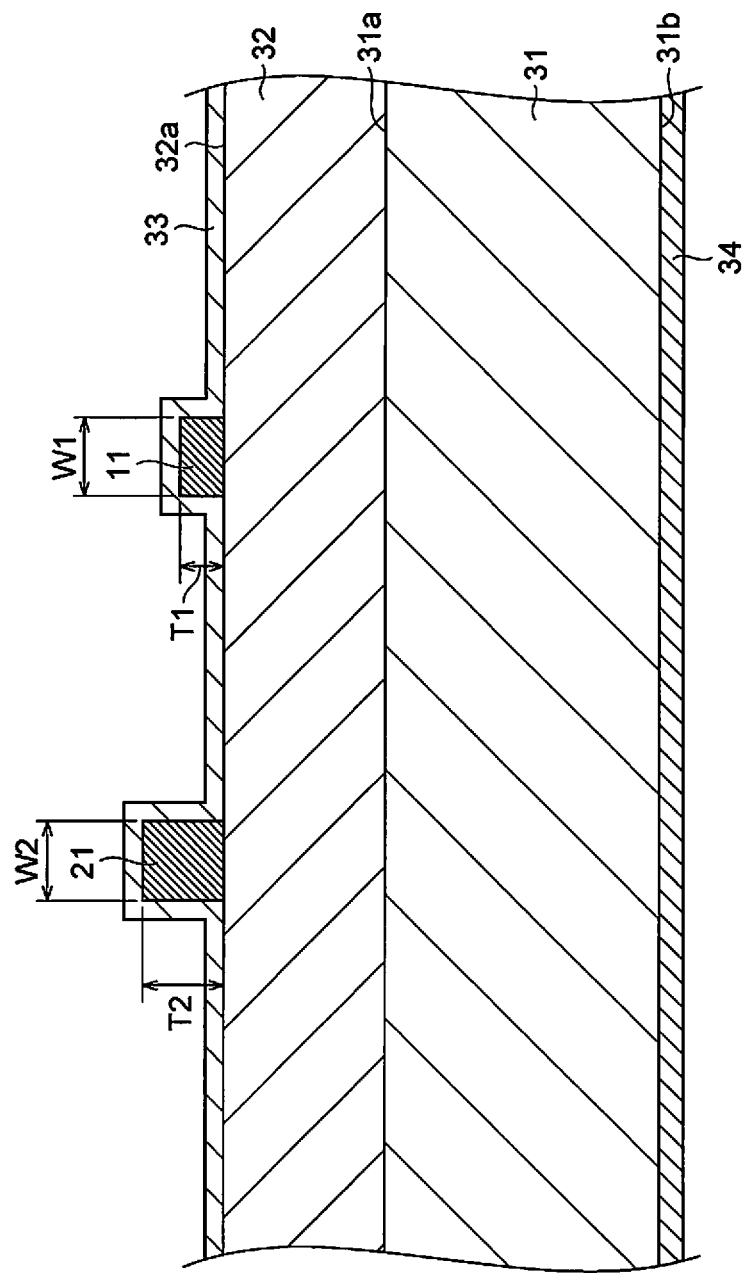
FIG. 2 illustrates a cross-section taken along line II-II of FIG. 1.

FIG. 2 illustrates a cross-section taken along line II-II of FIG. 1. In FIG. 2, the insulating layer 32 is provided on a first face 31a of the semiconductor substrate 31. The semiconductor substrate 31 is an Si substrate, an SiC substrate, or an InP substrate, for example. The semiconductor substrate 31 in this embodiment is an InP substrate, and has a thickness of about 100 μm and a dielectric constant of 12.4. The insulating layer 32 is an insulating layer that contains at least one of an inorganic material, an organic material, and a polymer (resin composite). The insulating layer 32 may include a plurality of layers. The insulating layer 32 in this embodiment is a double-layered film composed of a benzocyclobutene film and a silicon-oxide film. The benzocyclobutene film has a thickness of 0.85 μm and a dielectric constant of 2.5, for example. The silicon-oxide film has a thickness of 0.3 μm and a dielectric constant of 4, for example. Therefore, the dielectric constant of the insulating layer 32 is lower than that of the semiconductor substrate 31.

On a surface 32a of the insulating layer 32, the input line 11 and the output line 21 are provided. Specifically, the input line 11 and the output line 21 are provided so as to touch the same surface 32a of the same insulating layer 32. The input line 11 and the output line 21 are wiring containing gold (Au) or wiring formed of an alloy that contains Au, as described later. The input line 11 and the output line 21 have an almost identical composition, and may be single-layered or may include a plurality of layers. In a case where the output line 21 includes a plurality of layers, the output line 21 may include a conductive layer having a composition almost identical to that of the input line 11 and a thickness substantially the same as the input line 11.

Note that the terms "substantially the same" and "almost identical" used herein not only means "completely the same or identical" but also means that a difference in dimensions, content, or the like between two objects that are compared to each other is equal to or less than a measurement error, a tolerance estimated in the design, or the like, and the two objects can be regarded as the same.

Figure 3:
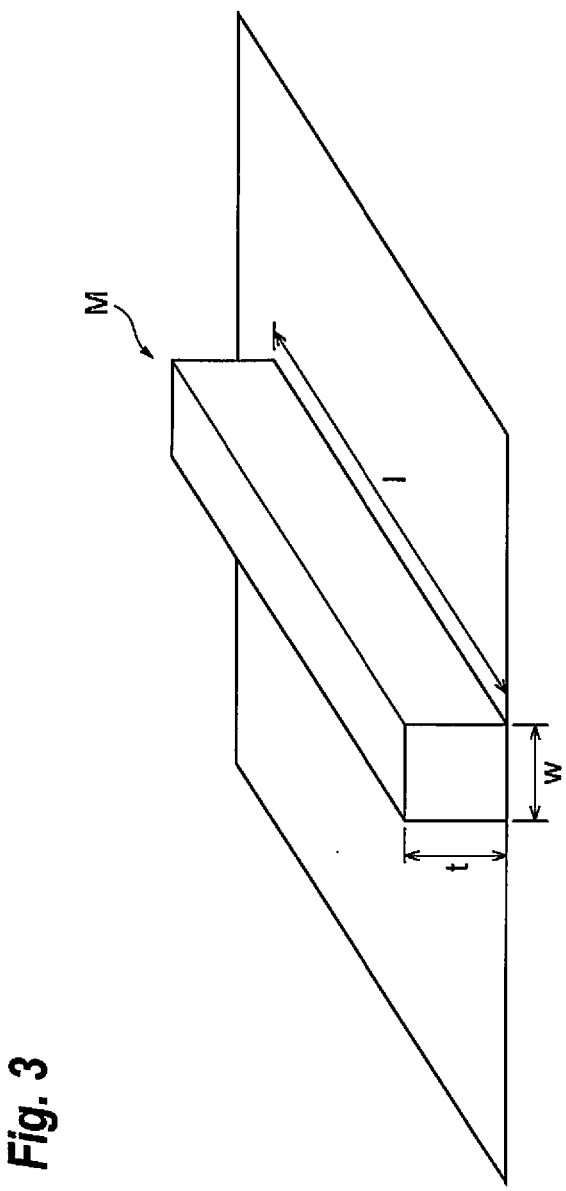
FIG. 3 is a schematic diagram illustrating metal wiring and is referred to for calculating a DC resistance.

A calculation method for the DC resistances of the input line 11 and the output line 21 is described with reference to FIG. 3. FIG. 3 is a schematic diagram illustrating metal wiring and is referred to for calculating the DC resistances. As illustrated in FIG. 3, the length of metal wiring M having a rectangular cross-section is denoted by l, the width in the horizontal direction is denoted by w, the thickness in the vertical direction is denoted by t, and the resistivity is denoted by ρ. Note that the metal wiring M is formed of the same material as the input line 11 and the output line 21. In this case, the DC resistance (wiring resistance) R of the metal wiring M is calculated by using Eq. 4 below. In Eq. 4, the DC resistance R increases as the length l becomes larger, and the DC resistance R increases as the width w and the thickness t becomes smaller.

$$R = \rho \frac{l}{(w \cdot t)} \quad (4)$$

Referring back to FIG. 2, the thickness T1 of the input line 11 is between 2.0 μm and 3.0 μm, for example. The thickness T2 of the output line 21 is between 4.0 μm and 5.0 μm, for example. The thickness T1 and the thickness T2 are different from each other, and the thickness T1 is smaller than the thickness T2. In this embodiment, the thickness T1 is 2.4 μm, for example, and the thickness T2 is 4.5 μm, for example. The width W1 of the input line 11 is between 4.0 μm and 6.0 μm, for example, and the width W2 of the output line 21 is between 10.0 μm and 12.0 μm, for example. Therefore, the aspect ratio (T1/W1) of the thickness T1 of the input line 11 relative to the width W1 of the input line 11 is between 0.33 and 0.75. The aspect ratio (T2/W2) of the thickness T2 of the output line 21 relative to the width W2 of the output line 21 is between 0.33 and 0.5.

Here, a current that flows through the input line 11 is denoted by C1, and a current that flows through the output line 21 is denoted by C2. Then, it is preferable that the ratio (A2/A1) of the cross-section area A2 (A2=T2×W2) of the output line 21 relative to the cross-section area A1 (A1=T1× W1) of the input line 11 be equal to or larger than the ratio (C2/C1) of the current C2 relative to the current C1. In this case, amplified signals that are output on the basis of signals input from the input line 11 to the first differential amplifier 10(1) to the N-th differential amplifier 10(N) can smoothly flow through the output line 21. For a metal (alloy) used to form the lines, a maximum current density needed to attain long-term reliability is determined. By keeping the ratio between the current C1 of the input line 11 and the current C2 of the output line 21 and the ratio between the cross-section area A1 of the input line 11 and the cross-section area A2 of the output line 21 so as to have a constant relation, it is possible to make the input line 11 and the output line 21 have a current density of the same level which does not exceed the maximum current density.

On the insulating layer 32, a passivation layer 33 that protects the input line 11 and the output line 21 is provided. Therefore, the input line 11 and the output line 21 are covered by the passivation layer 33. The passivation layer 33 is an insulating layer having moisture resistance and the like, for example. In this embodiment, the passivation layer 33 is a silicon-nitride film. The passivation film 33 has a thickness of 0.3 μm and a dielectric constant of 7.7, for example.

On a second face 31b of the semiconductor substrate 31 opposite to the first face 31a, a metal layer 34 having a reference level is provided, for example. The metal layer 34 is a metal layer containing gold (Au) or a metal layer formed of an alloy that contains Au. The metal layer 34 can be connected to the first differential amplifier 10(1) to the N-th differential amplifier 10(N) through via holes or the like provided in the semiconductor substrate 31. The input line 11 and the metal layer 34 are electromagnetically coupled to each other via the semiconductor substrate 31 and the insulating layer 32 to thereby constitute a transmission line having predetermined characteristic impedance. Similarly, a transmission line having predetermined characteristic impedance is constituted by the output line 21 and the metal layer 34.

Figure 4A:
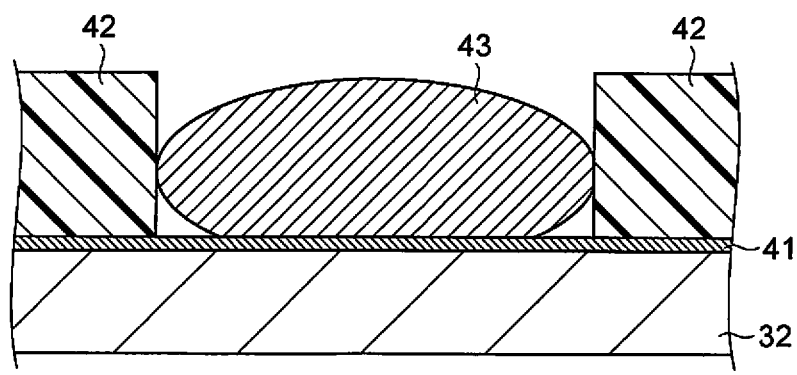
FIGS. 4A to 4C illustrate cross-sections for describing a production method for an output line of the TWA according to the embodiment.
Figure 4B:
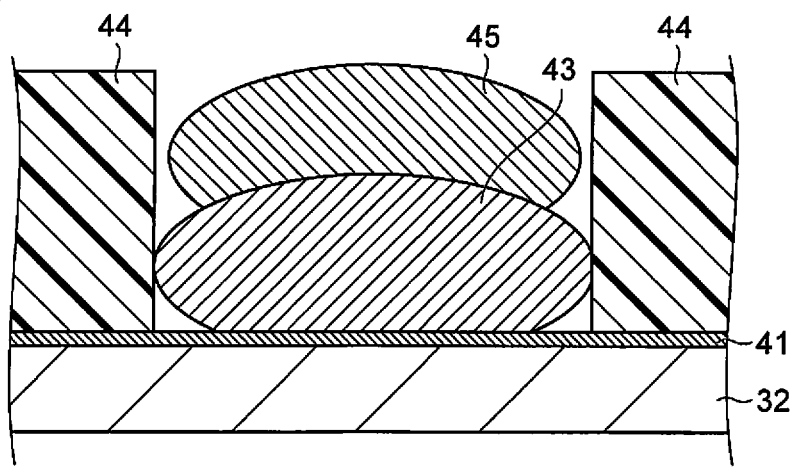
Figure 4C:
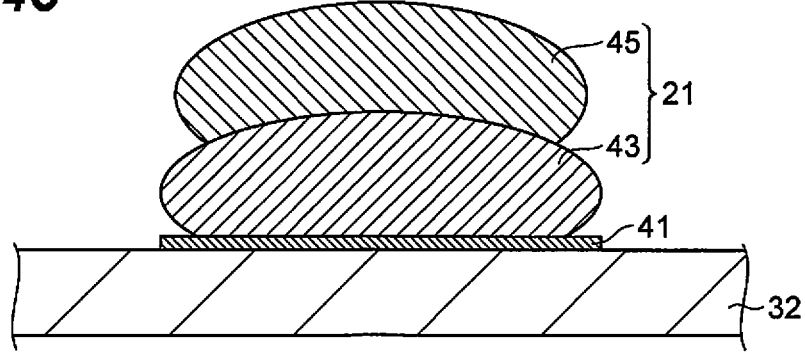

Next, a production method for the output line 21 of the TWA 1 according to this embodiment is described with reference to FIGS. 4A to 4C and FIG. 5. FIGS. 4A to 4C illustrate cross-sections for describing a production method for the output line 21 of the TWA 1 according to this embodiment.

First, as illustrated in FIG. 4A, a metal thin film 41 is formed on the insulating layer 32 by sputtering or the like. Next, a photoresist 42 (also referred to as a first photoresist) that is patterned by photolithography, for example, is formed on the metal thin film 41. Thereafter, a conductive layer 43 is formed on a region from which part of the photoresist 42 is removed so that the metal thin film 41 is exposed. In this embodiment, the metal thin film 41 serves as a seed layer, and the conductive layer (metal layer) 43 is formed by metal plating. By performing metal plating, the conductive layer 43 having a predetermined height (also referred to as a first thickness) can be easily formed. The conductive layer 43 may be formed by electroplating or by electro-less plating. After the conductive layer 43 has been formed, the photoresist 42 is removed by etching or the like. It should be understood from the drawings and the description herein that a section of the conductive layer 43 subsequently forms the input line 11, and is referred to herein below as an input conductive layer. Similarly, another section of the conductive layer 43 subsequently forms a portion of the output line 21 and is also referred to herein below as a first conductive layer.

Next, as illustrated in FIG. 4B, a photoresist 44 (also referred to as a second photoresist) that has a second height (referred to herein below as a second thickness) that is greater than the predetermined height (the first thickness) of the photoresist 42 is formed on the metal thin film 41 by photolithography, for example. The photoresist 44 is at least thicker than the conductive layer 43. Although not illustrated, the photoresist 44 is formed so as to cover the metal thin film 41 and part of the conductive layer 43 that has been formed. In a region on which the photoresist 44 is formed, the metal thin film 41 is not exposed. The photoresist 44 is formed so as to expose only part of the conductive layer 43. Next, a conductive layer 45 (also referred to as a second conductive layer) is formed on a region from which part of the photoresist 44 is removed so that the conductive layer 43 is exposed. In this embodiment, the conductive layer 43 serves as a seed layer, and the conductive layer (metal layer) 45 is formed by metal plating. As a result, a region on which only the conductive layer 43 is formed (defining the input line 11), a region on which the conductive layers 43 and 45 are layered and formed (defining the output line 21), and a region on which neither the conductive layer 43 nor the conductive layer 45 are formed are provided on the metal thin film 41. In this way, by forming the conductive layer 45 only on a predetermined region on the conductive layer 43, the working time for forming wiring can be reduced compared to a case where a thin plated layer and a thick plated layer are simply formed by performing independent plating processes respectively. Further, by using the photoresists 42 and 44, the line widths of the conductive layers 43 and 45 can be adjusted with high precision. In a case where a metal plating process is independently performed twice, a photoresist may remain in an overlapping portion of the plated layers, or the overlapping portion may become thick unsuitably. However, with the forming method for the conductive layers 43 and 45 according to this embodiment, the photoresists hardly remain and the overlapping portion of the conductive layers 43 and 45 hardly becomes thick. Accordingly, a fine flatness is achievable for the conductive layers 43 and 45 in this embodiment.

Figure 5:
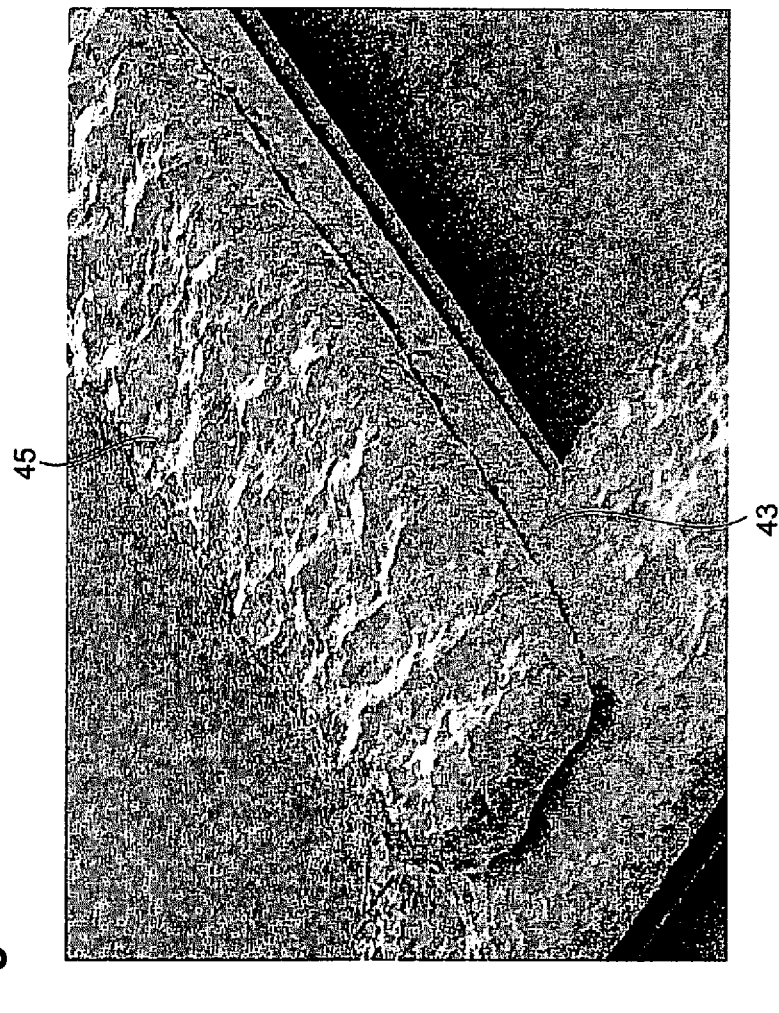
FIG. 5 is a scanning electron microscope (SEM) image of conductive layers formed by using the production method described with reference to FIGS. 4A to 4C.

Next, the photoresist 44 is removed by using an etching solution or the like, as illustrated in FIG. 4C. Thereafter, the metal thin film 41 in the region on which neither the conductive layer 43 nor the conductive layer 45 is formed is removed by using an etching solution or the like. With the method described above, the output line 21 having a structure in which the conductive layer 43 and the conductive layer 45 are layered can be formed. Further, the conductive layer 43 in the region on which only the conductive layer 43 is formed can be used as the input line 11. FIG. 5 is an image of the conductive layers formed by using the production method described above, the image being captured by using a scanning electron microscope (SEM). In FIG. 5, the "thick" region on which the conductive layers 43 and 45 are layered and the "thin" region on which only the conductive layer 43 is formed are formed. In FIG. 5, the "thick" region and the "thin" region are connected only for an illustration. It does not mean that the input line 11 and the output line 21 should be connected to each other in this embodiment.

Figure 9:
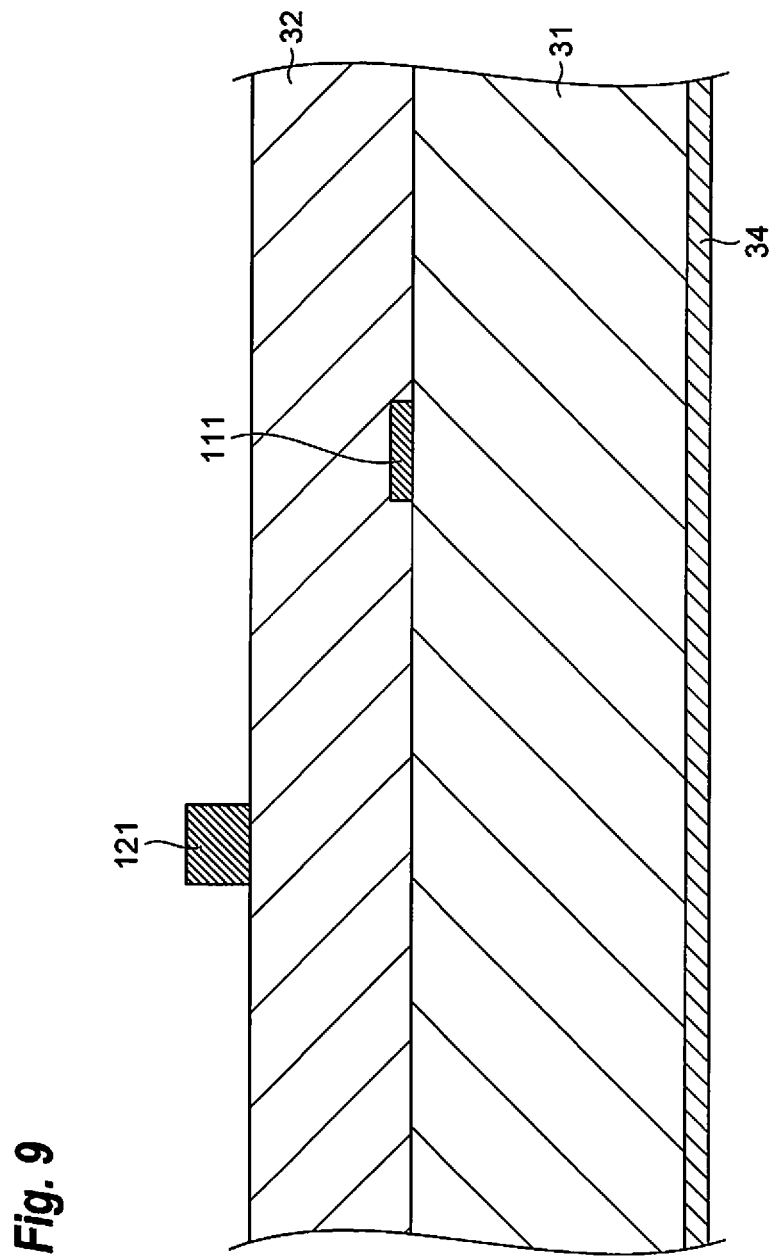
FIG. 9 illustrates a cross-section taken along line IX-IX of FIG. 7.

Effects attained by the TWA 1 according to this embodiment described above are as follows. First, a description of the TWA 101 according to the comparative example is given. The input line 111 of the TWA 101 according to the comparative example is provided between the semiconductor substrate 31 and the insulating layer 32, as illustrated in FIG. 9. As described above, in order to restrain degradation of high-speed response of the TWA 101, it is better to decrease the parasitic capacitance $C_{in}$ of the input line 111. However, it is difficult to decrease the line width of the input line 111 in order to decrease the parasitic capacitance $C_{in}$ of the input line 111 because the flatness of the insulating layer 32 provided on the input line 111 is affected and because the aspect ratio of the input line 111 is limited. For the output line 121, it is required to increase the current-carrying capacity and to restrain the area from increasing. However, it is difficult to simultaneously attain both the increase and the restraint, as the two requirements have a trade-off relation.

On the other hand, in the TWA 1 according to this embodiment, the input line 11 connected to the input terminal 10a is provided so as to touch the surface 32a of the insulating layer 32, not between the semiconductor substrate 31 and the insulating layer 32. Accordingly, the flatness of the insulating layer 32 is not affected even if the input line 11 is thickened. As a result, the input line 11 can be made thicker regardless of the flatness of the insulating layer 32, and the cross-section area A1 of the input line 11 can be increased. The input line 11 and the output line 21 are provided so as to touch the same surface 32a of the same insulating layer 32, and therefore, the thicknesses of the input line 11 and the output line 21 can be set so as to have different values. The output line 21 can be provided so as to touch the surface 32a of the flat insulating layer 32, and therefore, it is possible to increase the ratio (T2/W2) of the thickness T2 of the output line 21 relative to the width W2 of the output line 21. Accordingly, it is possible to increase the cross-section area A2 of the output line 21 without increasing the area by widening the line width of the output line 21 on the surface 32a of the insulating layer 32. Consequently, a decrease in the cut-off frequency of the input line 11 is restrained, and the current-carrying capacity of the output line 21 is suitably increased while an increase in the area of the output line 21 is restrained. That allows the TWA 1 to output driving signals having large amplitude. An increase in the area can be restrained, and therefore, it is possible to provide the TWA 1 that is downsized.

In addition, the input line 11 of the TWA 1 according to this embodiment is electromagnetically coupled to the metal layer 34 via the semiconductor substrate 31 and the insulating layer 32, while the input line 111 of the TWA 101 according to the comparative example is electromagnetically coupled to the metal layer 34 via the semiconductor substrate 31 (for the comparative example, see FIG. 9). Therefore, the distance between the input line 11 and the metal layer 34 is longer than the distance between the input line 111 and the metal layer 34, and the parasitic capacitance of the input line 11 is smaller than the parasitic capacitance $C_{in}$ of the input line 111 when the parasitic capacitances are compared on the basis of the same line length. Consequently, the characteristic impedance of the input line 11 can be set to a predetermined value more easily, and a decrease in the cut-off frequency of the input line 11 can be effectively restrained. Note that, for a coplanar line, characteristics of the transmission line are determined depending on electromagnetic coupling between signal wiring and ground wiring (not illustrated in FIGS. 2 and 9) which is arranged on each side of the signal wiring at a certain distance, and the parasitic capacitance $C_{in}$ affects the characteristics.

The output line 21 may include the conductive layer 43 having an almost identical composition and substantially the same thickness as the input line 11. In this case, by plating only part of the conductive layer 43, for example, the region formed only of the conductive layer 43 can be used as the input line 11, and the region on which the conductive layer 45 is further formed on the conductive layer 43 can be used as the output line 21. In this way, the output line 21 having a thickness different from that of the input line 11 can be easily formed.

The input line 11 and the output line 21 may be formed by metal plating. In this case, the input line 11 and the output line 21 having a large thickness can be easily formed.

The thickness T2 of the output line 21 may be larger than the thickness T1 of the input line 11. In general, the amount of current that flows through the output line 21 in response to signals amplified by the first differential amplifier 10(1) to the N-th differential amplifier 10(N) is larger than the amount of current that flows through the input line 11 in response to input signals. By increasing the cross-section area A2 of the output line 21, however, the DC resistance can be relatively reduced, and power saving of the TWA 1 can be attained.

The current value of a current input to the input line 11 is denoted by C1, and the current value of a current output to the output line 21 is denoted by C2. Then, the ratio (A2/A1) of the cross-section area A2 of the output line 21 relative to the cross-section area A1 of the input line 11 may be equal to or larger than the ratio (C2/C1) of the current value C2 relative to the current value C1. In this case, the current density (C1/A1) of a current that flows through the input line 11 and the current density (C2/A2) of a current that flows through the output line 21 can be kept smaller than the maximum current density.

Operative Example

The present invention is further described in detail with reference to an operative example below. However, the present invention is not limited to such an operative example.

Specific Examples of Input Line and Output Line

Figure 7:
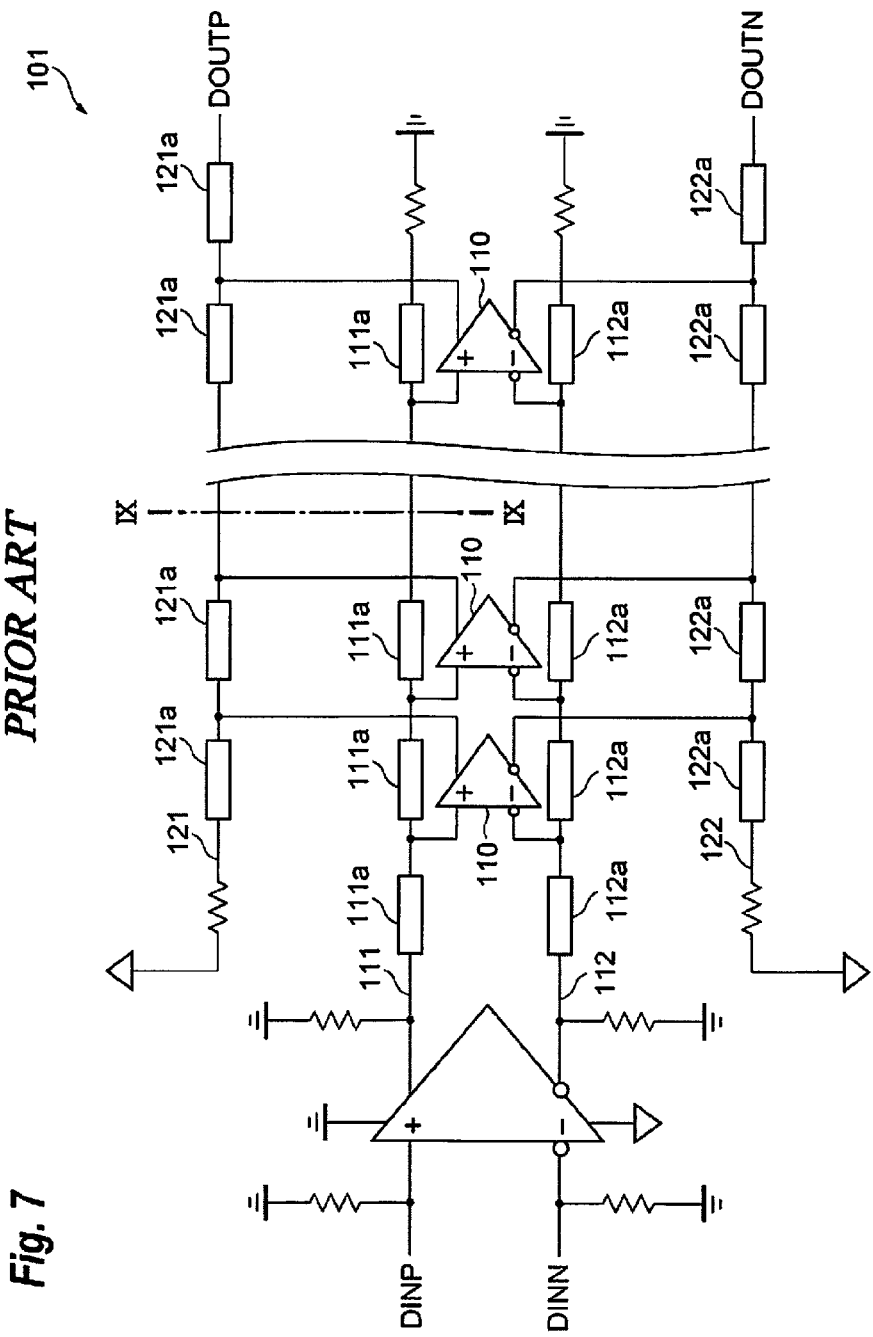
FIG. 7 is an equivalent circuit diagram of the comparative example.
Figure 8:
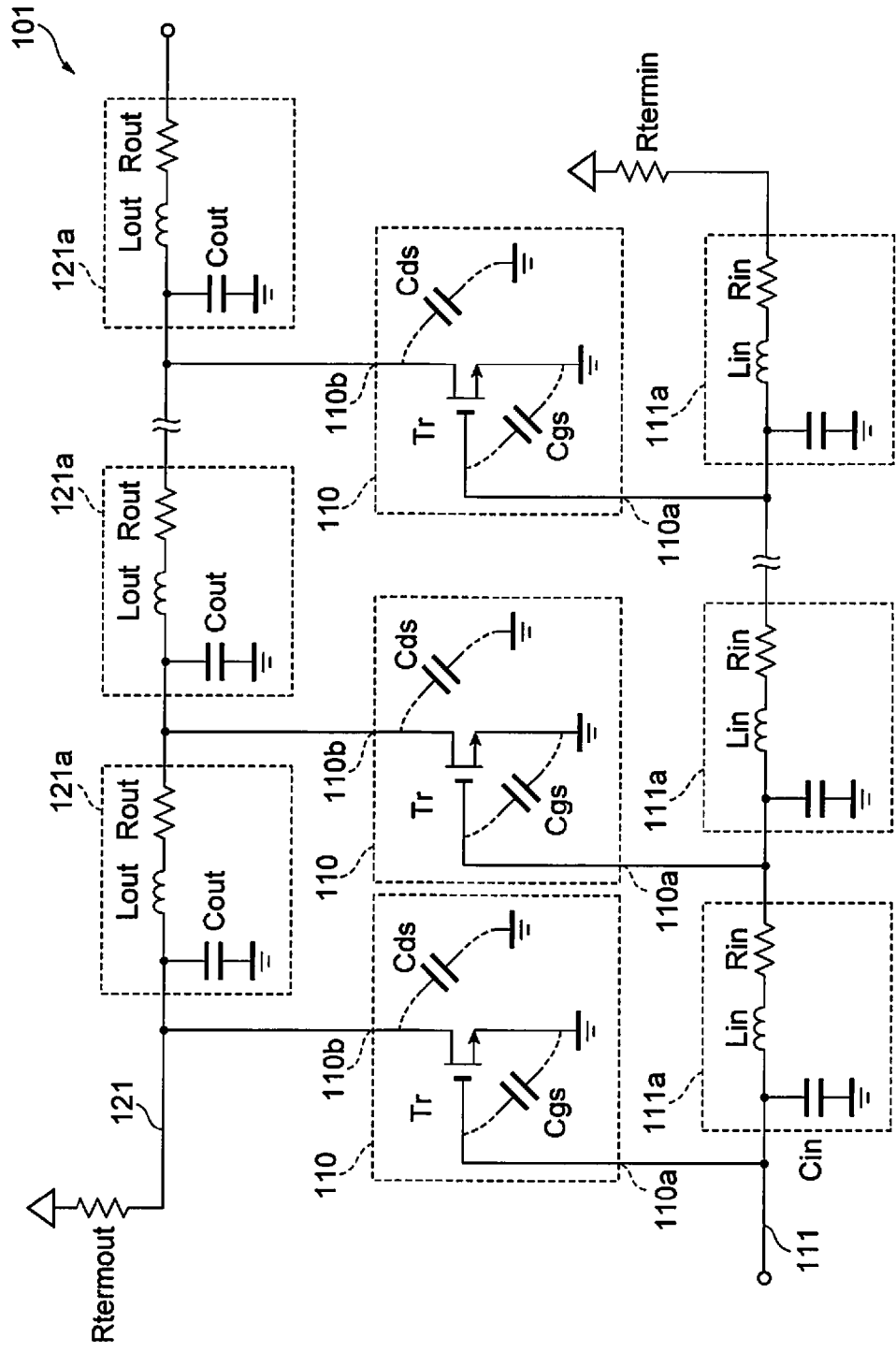
FIG. 8 illustrates an example of an equivalent circuit diagram where amplifier cells are implemented as single-ended circuits.

Specific examples of characteristics of the input lines and the output lines of the TWA 1 according to the embodiment of the present application and the TWA 101 according to the comparative example are shown below. The TWA 1 illustrated in FIG. 1 is used as the embodiment of the present application, and the TWA 101 illustrated in FIG. 7 is used as the comparative example. The thickness and width of the input line 111 of the TWA 101 produced on an experimental basis and those of the input line 11 and the output line 21 of the TWA 1 produced on an experimental basis are measured, and the impedance, the maximum current, and the DC resistance per 1 μm length are calculated on the basis of the obtained thicknesses and widths. Here, the impedance is calculated by using a three-dimensional electromagnetic simulator while the transistor capacitances of the TWAs 1 and 101 are assumed to be 15 fF, the parasitic capacitances of the input line 11 and the output line 21 are assumed to be 5 fF, and the parasitic capacitance of the input line 111 is assumed to be 10 fF. The measured results and calculated results for the input lines 11 and 111 and the output line 21 are shown in Table I. Conditions of the impedance, the maximum current, and the DC resistance per 1 μm of a transmission line which are required for a typical TWA are shown in Table II.

TABLE I

|  | Thickness/ width [μm] | Impedance [ohm] | Maximum current [mA] | DC resistance [ohm/μm] |
|---|---|---|---|---|
| Input line 111 | 1.1/4 | 51.9 | 12 | 0.01 |
| Input line 11 | 2.4/4.5 | 62.2 | 27 | 0.003 |
| Output line 12 | 4.5/10 | 58.3 | 120 | 0.0006 |

TABLE II

|  | Impedance [ohm] | Maximum current [mA] | DC resistance [ohm/μm] |
|---|---|---|---|
| Input line | 50 or larger | 10 or larger | Less than 0.005 |
| Output line | 50 or larger | 100 or larger | Less than 0.005 |

As illustrated in Table I, the aspect ratio of the thickness of the input line 111 relative to the width of the input line 111 according to the comparative example is about ¼, and the aspect ratio of the thickness of the input line 11 relative to the width of the input line 11 according to the embodiment of the present application is about ½. That is, the aspect ratio of the input line 11 is larger than that of the input line 111. The impedance and maximum current (allowable amount of current) of the input line 11 are larger than those of the input line 111, and the DC resistance of the input line 11 is smaller than that of the input line 111. These values are resulted from the fact that the cross-section area of the input line 11 is larger than that of the input line 111, and that the input line 111 is covered by the insulating layer 32.

When Table I and Table II are compared to each other, it is found that the input line 11 according to the embodiment of the present application satisfies the conditions shown in Table II; however, the input line 111 according to the comparative example does not satisfy the condition of the DC resistance per 1 μm length shown in Table II. Although the input line 111 satisfies the conditions of the impedance and the maximum current shown in Table II, the input line 111 does not have sufficient margins for the impedance and the maximum current. On the other hand, the input line 11 and the output line 21 according to the embodiment of the present application satisfy all of the conditions shown in Table II.

Evaluation of TWA

Figure 6:
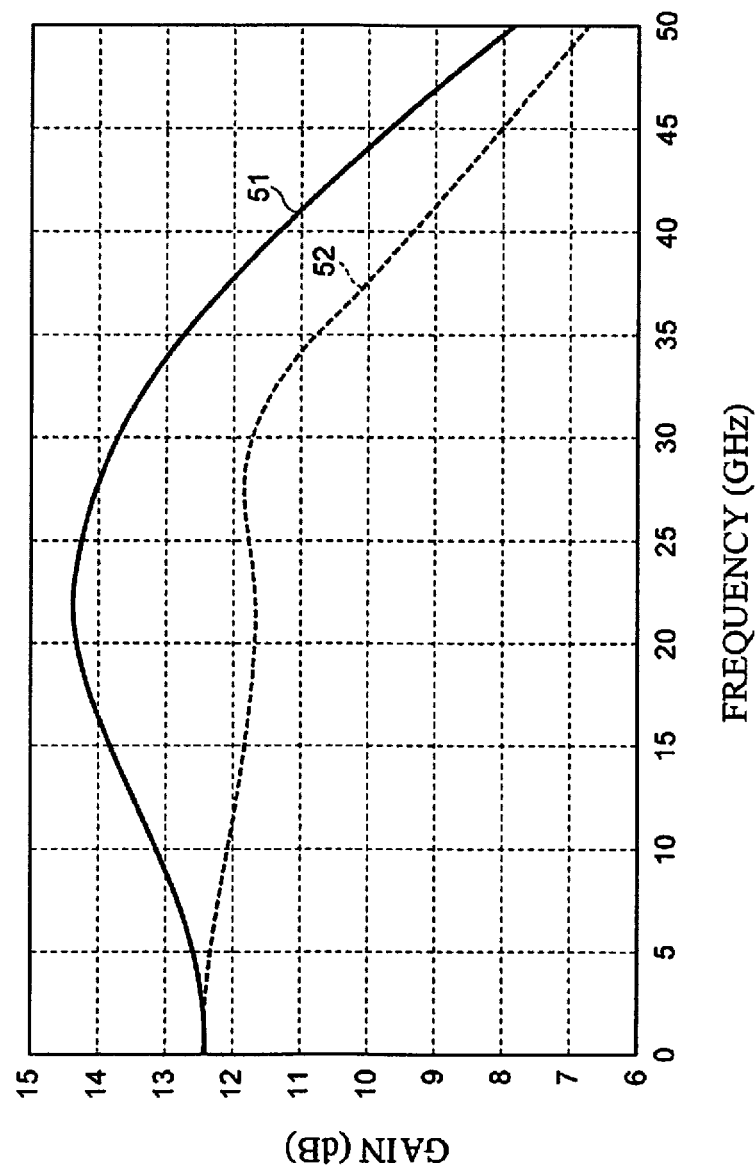
FIG. 6 includes graphs illustrating gain-frequency characteristics of a TWA according to an operative example and those of a TWA according to a comparative example.

FIG. 6 includes graphs illustrating the measured results of gain-frequency characteristics of the TWA 1 according to the embodiment of the present application and those of the TWA 101 according to the comparative example. In FIG. 6, the vertical axis represents the gain defined as |Vout−VoutB|/|VIN−VINB|, and the horizontal axis represents the frequency. The graph 51 indicates the measured results of the TWA 1 according to the embodiment of the present application, and the graph 52 indicates the measured results of the TWA 101 according to the comparative example. It is defined that the bandwidths of the TWAs 1 and 101 respectively range up to points at which the values of the gains of the TWAs 1 and 101 are 3 dB lower than the respective values of the gains of the TWAs 1 and 101 at 0 GHz. As found from FIG. 6, the bandwidth of the TWA 1 ranges from 0 GHz to about 47 GHz, and the bandwidth of the TWA 101 ranges from 0 GHz to about 42 GHz. Accordingly, the bandwidth of the TWA 1 is wider than that of the TWA 101. This wider bandwidth is considered to be attained by reduction in the DC resistances and restraint of the parasitic capacitances of the input line 11 and the output line 21 of the TWA 1.

A TWA according to the present invention is not limited to the TWA according to the embodiment described above, and various modifications can be made. For example, the insulating layer 32 in the above-described embodiment may include a silicon oxi-nitride film (SiON film) having a dielectric constant of 6.2 or may include a resin film coated with fluoride material having a dielectric constant of 2.3 (Al-Polymer from Asahi Glass Co., Ltd.), for example.

What is claimed is:

1. A traveling-wave amplifier that receives an input signal and generates an output signal derived from the input signal, the traveling-wave amplifier comprising:
   a semiconductor substrate having a first face;
   a plurality of amplifier cells provided on the first face of the semiconductor substrate, each of the amplifier cells receiving the input signal and generating a part of the output signal derived from the input signal;
   an insulating layer provided on the first face of the semiconductor substrate, the insulating layer having a surface on the first face of the semiconductor substrate;
   an input line provided on the insulating layer in direct contact therewith, the input line being configured to externally receive the input signal at one end thereof and transmit the input signal to respective ones of the amplifier cells, the input line having a first thickness; and
   an output line provided on the insulating layer in direct contact therewith, the output line being configured to transmit the respective parts of the output signal generated by the amplifier cells and externally output the output signal from one end thereof, the output line having a second thickness larger than the first thickness.

2. The traveling-wave amplifier according to claim 1,
   wherein the input line includes an input conductive layer having a first line width, and
   wherein the output line includes a first conductive layer and a second conductive layer provided on the first conductive layer, the second conductive layer having a second line width substantially equal to the first line width.

3. The traveling-wave amplifier according to claim 2,
   wherein the input line further includes a metal thin film between the insulating layer and the input conductive layer,
   wherein the input conductive layer is provided on the metal thin film.

4. The traveling-wave amplifier according to claim 3,
   wherein the input signal includes a first current flowing through the input line, wherein the respective parts of the output signal includes a second current flowing through the output line, and
   wherein the input line has a first cross-section area and the output line has a second cross-section area, with a ratio of the second cross-section area relative to the first cross-section area being equal to or larger than a ratio of the second current relative to the first current.

5. The traveling-wave amplifier according to claim 1,
   wherein the input line includes an input conductive layer and a metal thin film between the insulating layer and the input conductive layer,
   wherein the output line includes a first conductive layer and a second conductive layer provided on the first conductive layer,
   wherein the input conductive layer is provided on the metal thin film.

6. The traveling-wave amplifier according to claim 5,
wherein the input signal includes a first current flowing through the input line,
wherein the output signal includes a second current flowing through the output line, and
wherein the input line has a first cross-section area and the output line has a second cross-section area, a ratio of the second cross-section area relative to the first cross-section area being equal to or larger than a ratio of the second current relative to the first current.

7. The traveling-wave amplifier according to claim 1,
wherein the input signal includes a first current flowing through the input line,
wherein the output signal includes a second current flowing through the output line, and
wherein the input line has a first cross-section area and the output line has a second cross-section area, a ratio of the second cross-section area relative to the first cross-section area being equal to or larger than a ratio of the second current relative to the first current.

8. A production method for a traveling-wave amplifier including a plurality of amplifier cells formed on a semiconductor substrate, an input line and an output line, each of the amplifier cells receiving an input signal and generating a part of an output signal derived from the input signal, the input line being configured to externally receive the input signal at one end thereof and transmit the input signal to respective ones of the amplifier cells, the output line being configured to transmit respective parts of the output signal generated by the amplifier cells and externally output the output signal from one end thereof, the production method comprising the steps of:

forming an insulating layer on the semiconductor substrate;

forming a metal thin film on the insulating layer;

forming a first photoresist on the metal thin film exposing regions corresponding to the input line and the output line;

forming, by plating, a first conductive layer on the metal thin film that is not covered by the first photoresist, the metal thin film serving as a seed layer;

removing the first photoresist and thereafter forming a second photoresist and patterning a region corresponding to the output line;

forming, by plating, a second conductive layer on the first conductive layer that is not covered by the second photoresist, the first metal layer serving as a seed layer; and removing the second photoresist and thereafter removing a region of the metal thin film on which the first metal layer is not formed.

9. The production method for the traveling-wave amplifier according to claim 8,
wherein the first photoresist is formed with a first thickness, and
wherein the second photoresist is formed with a second thickness larger than the first thickness.

10. The production method for the traveling-wave amplifier according to claim 9, wherein
the first conductive layer is formed with substantially the same thickness as the first thickness, and
wherein the second conductive layer is formed with a thickness that is substantially equal to a thickness obtained by subtracting the first thickness from the second thickness.

* * * * *